(12) United States Patent
Jung et al.

(10) Patent No.: US 6,951,708 B2
(45) Date of Patent: Oct. 4, 2005

(54) METHOD OF FORMING PHOTOSENSITIVE FILM PATTERN

(75) Inventors: Moon Youn Jung, Daejon-Shi (KR); Chi Hoon Jun, Daejon-Shi (KR)

(73) Assignee: Electronics and Telecommunications Research Institute, Daejon-shi (KR)

( * ) Notice: Subject to any disclaimer, the term of this patent is extended or adjusted under 35 U.S.C. 154(b) by 0 days.

(21) Appl. No.: 10/704,624

(22) Filed: Nov. 12, 2003

(65) Prior Publication Data

US 2004/0137374 A1 Jul. 15, 2004

(30) Foreign Application Priority Data

Nov. 12, 2002 (KR) ................................. 10-2002-0069883

(51) Int. Cl.[7] ............................. G03F 7/00; G03F 7/20
(52) U.S. Cl. .................... 430/313; 430/270.1; 430/311; 430/394; 430/396
(58) Field of Search .......................... 430/313, 270.1, 430/311, 394, 396

(56) References Cited

U.S. PATENT DOCUMENTS

| | | | |
|---|---|---|---|
| 6,165,892 A | * 12/2000 | Chazan et al. | ............. 438/623 |
| 6,245,663 B1 | * 6/2001 | Zhao et al. | ................. 438/622 |
| 6,265,301 B1 | * 7/2001 | Lee et al. | ................... 438/618 |
| 6,582,987 B2 | * 6/2003 | Jun et al. | ...................... 438/49 |

FOREIGN PATENT DOCUMENTS

| | | | |
|---|---|---|---|
| JP | 2001242618 | 9/2001 | |
| KR | 2002-95497 | 12/2002 | ............ H05K/3/40 |

OTHER PUBLICATIONS

English language translation of JP 2001–242618.*

* cited by examiner

*Primary Examiner*—Amanda Walke
(74) *Attorney, Agent, or Firm*—Mayer, Brown, Rowe & Maw LLP

(57) ABSTRACT

The present invention relates to a method of forming a photosensitive film pattern. It provides a method of forming a photosensitive film pattern capable of performing a photolithography process by blocking an opening of a high aspect ratio trench with a DFR film, during forming a semiconductor element and an MEMS element. In addition, it is possible to prevent the photoresist from flowing into the trench when the liquid photoresist is deposited by a spin coating method to form the photosensitive film pattern for metal pattern to apply electric signal from outside to inside of trench.

20 Claims, 8 Drawing Sheets

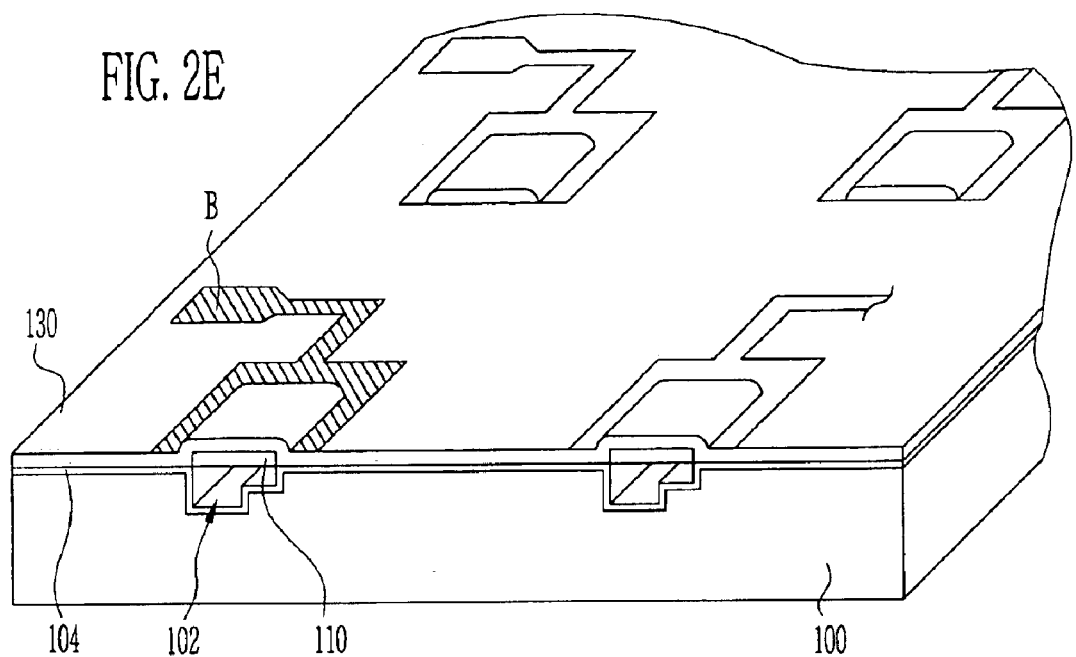
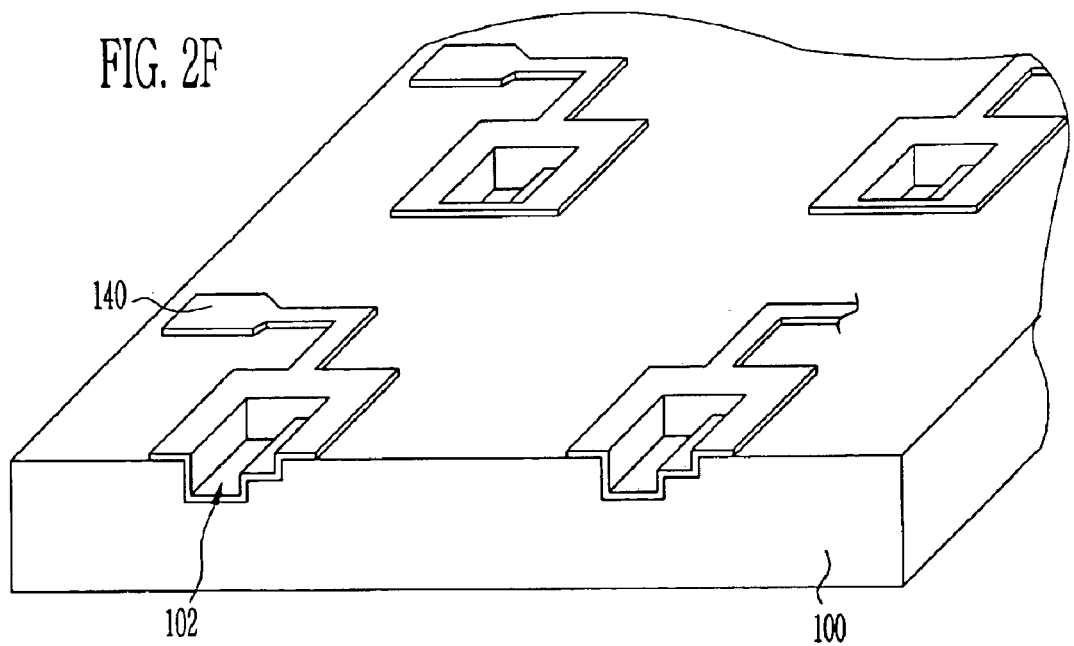

Trench edge

METHOD OF FORMING PHOTOSENSITIVE FILM PATTERN

BACKGROUND OF THE INVENTION

1. Field of the Invention

The present invention relates to a method of high aspect ratio lithography, and more specifically to a method of smoothly performing a photolithography process of the device in a semiconductor process or an MEMS process, etc. high aspect ratio.

2. Description of the Related Art

Recently, there are many kinds of elements requiring a processing technology in a range of several tens or several hundreds microns, such as a high aspect ratio inductor for RF circuit by means of a semiconductor process, an optical switch for an optical internet by means of a micro-machine (MEMS) process, and a fluid device flowing path in the filed of bio-element. Such a high aspect ratio device is mainly formed when a surface of silicon or glass substrate formed on trench areas is etched into a deep trench. Then, a thin film is formed on trench areas such as a trench bottom and trench walls, and non-trench areas after forming the deep trench, at the same time, and then the thin film including the trench areas is patterned. However, many technical difficulties occur at the time of carrying out the above processes.

FIGS. 1A to 1C are cross-sectional views illustrating problems in depositing a liquid photoresist for forming a conventional high aspect ratio element. Here, liquid photoresist is liquid phase before coating on wafer and it transform into solid film phase after soft backing at temperature of 90 degree. It is a conventional photoresist for semiconductor process.

Referring to FIGS. 1A to 1C, a liquid photoresist 13 is deposited on a semiconductor substrate or a glass substrate 10, in which a high aspect ratio trench 12 is formed, by using a spin coating method. Metal film 14 is deposited on trench. When the photoresist is thinly deposited, as shown in FIG. 1A, the photoresist 13 is not attached around the trench 12 in the upper part of it, whereby the thin films may be exposed to a gas or a etchant in the subsequent etching process and unprotected areas from the gas or the solvent might be removed. When the photoresist 13 is thickly deposited, as shown in FIG. 1B, since the thick photoresist 13 must be developed, it is difficult to obtain a sharp pattern after developing. When the photoresist 13 remains on the trench 12, as shown in FIG. 1C, the photoresist is not surely attached to the upper part of the trench, and the photoresist film is not readily removed from the wall of the trench and the bottom of the thin film. The reason is that the thick photoresist 13 still covers the bottom and the wall of the trench after finishing the developing process of the upper portion of the trench. In this case, if the photoresist 13 left in the trench is completely developed, the pattern on the trench is developed along with the photoresist, thereby the pattern might be diminished or removed. Since there are a lot of specific problems to be solved by the present invention, in addition to the above problems in the art, the present invention is not limited to a solution for the problems mentioned above. Furthermore, the scope of the present invention includes a solution to general problems occurring in a photolithography process due to the high aspect ratio structure, and a solution for problems in blocking the trench forming the high aspect ratio structure and then depositing the thin film.

SUMMARY OF THE INVENTION

The present invention is therefore contrived to solve the above problems, and it is an object of the present invention to provide a method of forming a photosensitive film pattern of a semiconductor element or an MEMS element with a high aspect ratio structure, wherein a photoresist pattern for a high aspect ratio structure can be stably formed by blocking an opening of a high aspect ratio trench with a dry film resister (DFR) film.

Accordingly, the present invention is provide a method of forming a photosensitive film pattern, comprising steps of: laminating a DFR film on a substrate formed a high aspect ratio trench; forming the DFR film pattern for blocking an opening of the trench by performing a first photolithography process; and forming the photosensitive film pattern by depositing a liquid photoresist on the whole resultant structure and performing a second photolithography process.

BRIEF DESCRIPTION OF THE DRAWINGS

The above and other objects, advantages and features of the present invention will become apparent from the following description of preferred embodiments given in conjunction with accompanying drawings.

FIGS. 2A to 2G are views illustrating a method of forming a dry film resist pattern of a semiconductor element or an MEMS element with a high aspect ratio structure according to the present invention.

DETAILED DESCRIPTION OF PREFERRED EMBODIMENTS

Figure 1A:
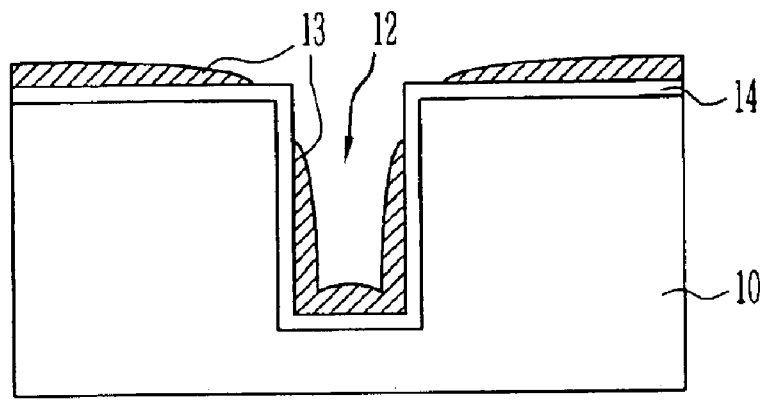
FIGS. 1A to 1C are cross-sectional views illustrating problems in depositing a liquid photoresist for forming a high aspect ratio structure.
Figure 1B:
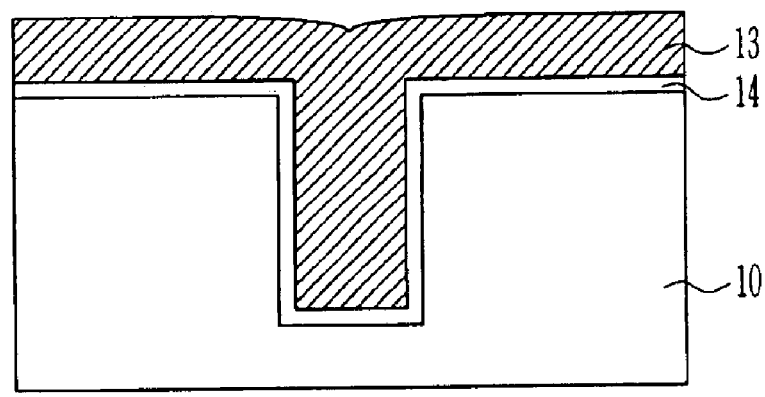
Figure 1C:
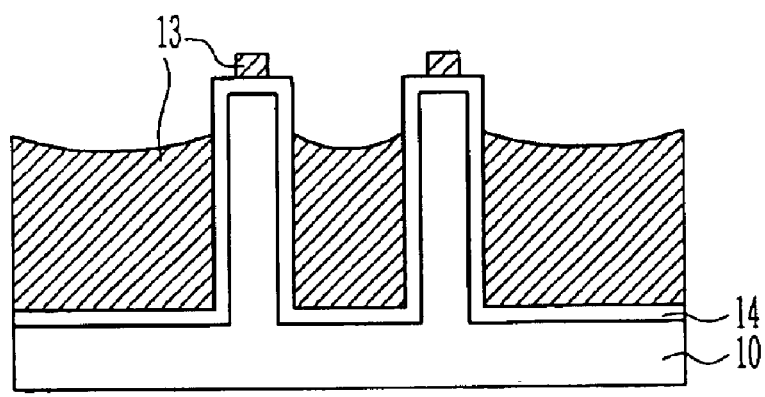

Now, embodiments of the present invention will be described in detail with reference to the appended drawings. However, the present invention is not limited to the embodiments to be disclosed in the following description, but can be implemented into various changes and modifications. Thus, the embodiments of the invention are only intended to completely inform those skilled in the art of the scope of the present invention. In the appended drawings, the same reference numerals indicate the same components.

Hereinafter, a term of "a high aspect ratio trench" adapted to the present invention refers to a trench having a depth in a range of approximately 1 to 1000 μm, and includes a trench for forming an inductor with a high aspect ratio structure, a trench for forming an optical switch, a trench for making fluid flow device in a bio-element, and a trench for contact or insulation in a semiconductor element. However, the high aspect ratio trench is not limited to the above, it can also be all the trenches formed in the MEMS element and the semiconductor element.

In the embodiment, a trench is formed in a semiconductor substrate or a glass substrate, an insulating layer is formed on the whole resultant structure, and a metal film layer is formed inside the trench as a wiring layer, in order to apply the electric signal from outside to inside of the trench.

FIGS. 2A to 2G are views for illustrating a method of forming a dry film resist pattern of a semiconductor element or an MEMS element with a high aspect ratio structure according to the present invention.

Figure 2A:
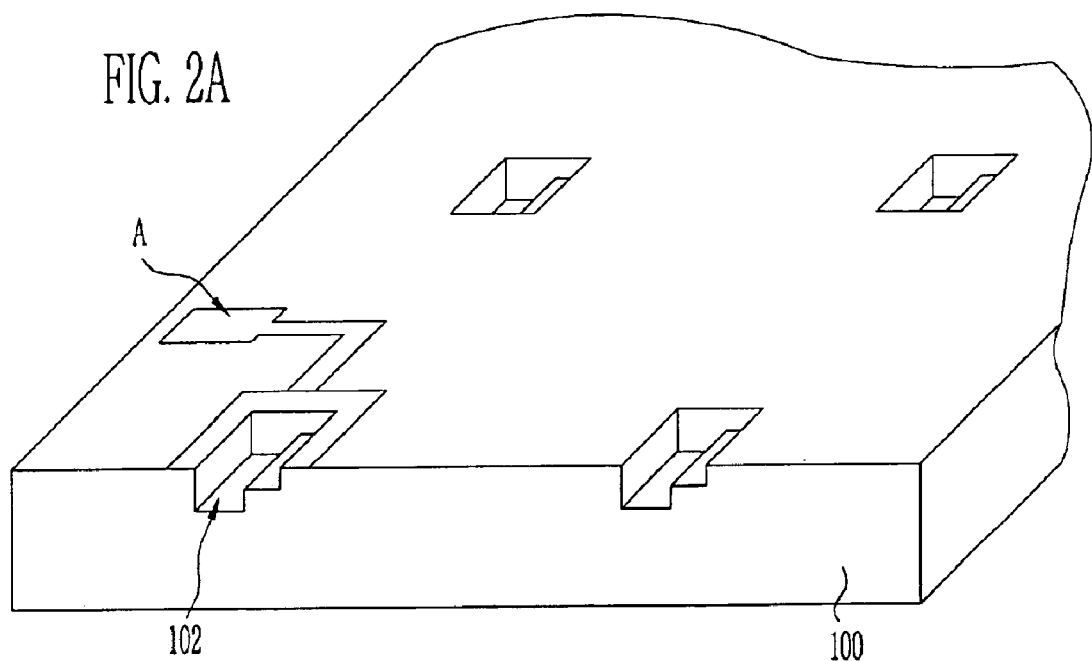

Referring to FIG. 2A, a part of the semiconductor substrate or a glass substrate 100 is removed and the resulting trench 102 is formed with a high aspect ratio. The substrate is removed by using a reactive ion etching (RIE), a wet etching, a dry etching or a plasma etching. In addition to the above etchings, various etchings for forming a semiconductor element or an MEMS element may be used. The semiconductor element or the MEMS element includes a high aspect ratio inductor in an optical switch, a micro fluid path, and a RF element.

FIG. 2A shows a two-step trench which has a step inside the highly stepped trench 102, by performing a patterning process two times. And the high aspect ratio trench is arranged in a matrix structure at orthogonal points of transverse axe and longitudinal axe. In addition, the dotted part (FIG. 2A, A) indicates a final metal film pattern in advance, and that is a position and shape of the wires to be formed in the embodiment of the present invention.

Figure 2B:
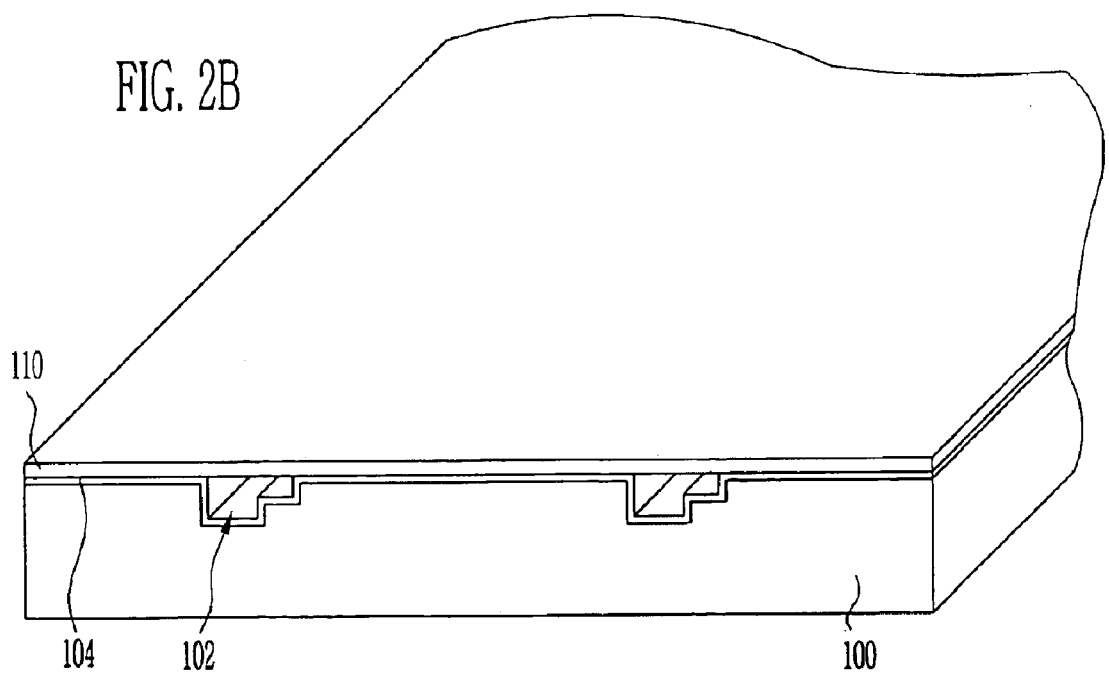

Referring to FIG. 2B, a metal film 104 is formed on the substrate 100 in which high aspect ratio trenches 102 are formed, and then a DFR film 110 is deposited on the whole resultant structure by a lamination method to block openings of the high aspect ratio trenches 102. The metal film 104 is formed in the high aspect ratio trenches 102 and on the semiconductor substrate or the glass substrate 100. The DFR film 110 may fill the high aspect ratio trenches 102, and may block only the openings of the trenches without filling the high aspect ratio trenches. In this embodiment, the DFR film 110 doses not fill the high aspect ratio trenches and blocks only the openings of the trenches to prevent the liquid photosensitive film from flowing into the trench in second lithography process.

Specifically, the DFR refers to a photosensitive film including a polymeric binder with excellent viscosity and photosensitivity. The embodiment uses a kind of a negative photosensitive film, in which a portion exposed to light is left and the other portion not exposed to light is removed in a developing process to form a pattern. The DFR film 110 is formed to have a thickness in a range of 1 to 70 $\mu$m, preferably 1 to 5 $\mu$m for forming the semiconductor element or the MEMS element. Furthermore, in the DFR structure, a photosensitive material is coated on the polyethylene terephthalate (PET) film, and then a polyethylene (PT) film is attached thereon.

The DFR film is formed under the processing conditions that DFR is deposited to a thickness in a range of 1 to 500 $\mu$m at a temperature in a range of 70 to 100° C. and is coated through a general adhesive lamination method, an extruding thermal lamination method.

Figure 2C:
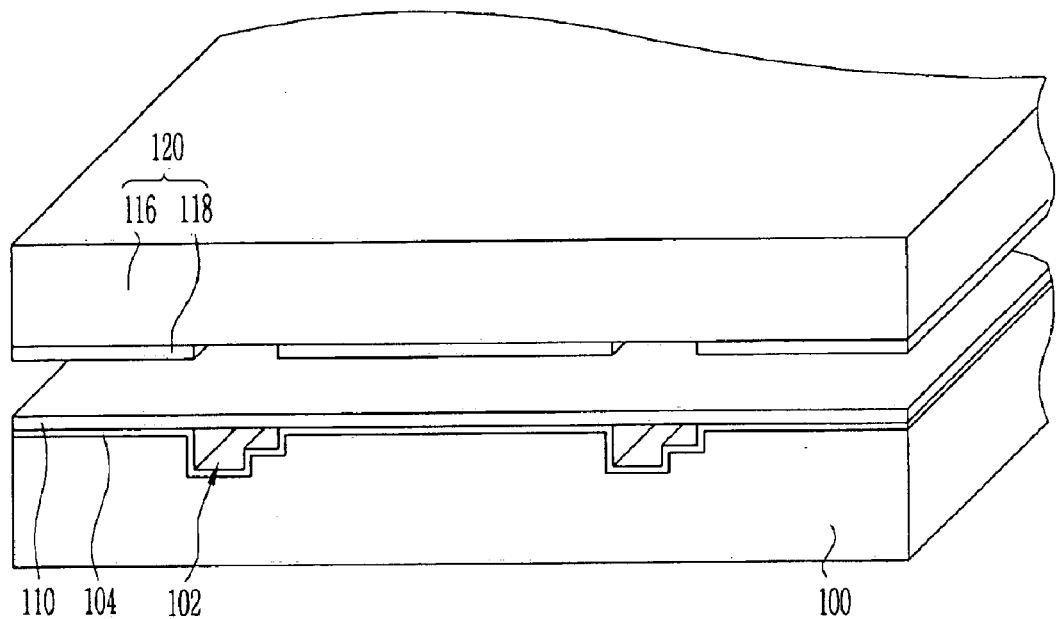

Referring to FIG. 2C, a reticle 120 is aligned with a pattern formed in a surface of the substrate 100, and then ultraviolet ray is allowed to partially pass through the pattern to expose the DFR film 110, wherein the reticle is patterned a light-shielding film 118 such as chrome (Cr) in a lower surface of a glass substrate 116. When the ultraviolet ray is applied on the reticle 120 aligned with the semiconductor substrate or the glass substrate 100, the ultraviolet ray cannot penetrate an area patterned with chrome but penetrate the upper part of the trenches 102 only, where is an area not pattern with the chrome. In the embodiment, the area exposed to the light is cured only, since the DFR film 110 is a negative photosensitive film. Furthermore, the reticle 120 used for forming the trenches is also used.

Figure 2D:
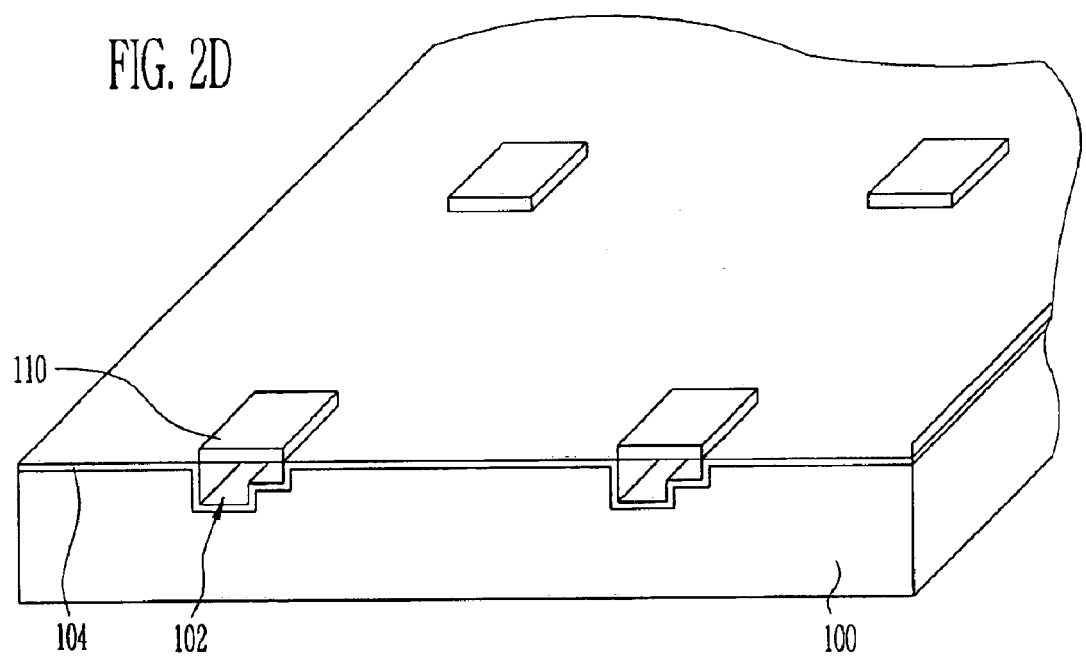

Referring to FIG. 2D, the exposed portion or the non-exposed portion is removed through the developing process with a developer. In this embodiment, the non-exposed portion is removed and the metal film 104 is patterned in a manner of covering the openings of the trenches 102, whereby the metal film 104 is exposed.

At that time, in order to prevent the DFR film 110 over the openings of the trenches 102 from sink into the bottom of the trenches 102, the reticle 120 used for forming the trenches 102 are used again and other exposure conditions should be considered different from those at the time of forming. That is, an exposing focal length of light in patterning the DFR film 110 is longer than that in forming the trenches 102, so that an exposed area of the DFR film 110 is slightly larger than the exposed area forming the trenches 102.

In addition, the boundary portion of the patterned DFR film 110 is formed slightly larger than the boundary portions of the openings of the trenches, whereby they are surely attached each other, thus, it is possible to keep the original positions even in the following developing process, water cleaning process, and spin dry process for drying water. The boundary portion of the patterned DFR film 110 is formed to be a size of about 1 to 5 $\mu$m larger than the boundary portions of the openings of the trenches 102. Therefore, by blocking the openings of the trenches 102 with the DFR film 110 in the element having the high aspect ratio trench 102, it is possible to prevent the photosensitive film from flowing into the trenches and to stably attach the spin coating photosensitive film to the edges of the openings of the trenches 102.

Referring to FIG. 2E, the liquid photosensitive film 130 used in the conventional semiconductor processes or MEMS processes is deposited by a spin coating method on the whole resultant structure, in which the patterned openings of the trenches are covered with the DFR film 110. The photolithography process using a reticle is carried out to form the photosensitive film pattern (not shown). In this embodiment, the photosensitive film, in which wire portions to be exposed on the trenches 102 and the predetermined areas other than the trenches are removed, is formed through the photolithography process. The hatched area (reference symbol B in FIG. 2E) in FIG. 2 is an area to be formed the metal line and it is to be exposed or not depending on the characteristic of the photosensitive film. In the photosensitive film pattern, the photosensitive film 130 remains on the high aspect ratio trench 102 of which the openings are blocked by the DFR film 110 and on the predetermined area (the metal wire forming area) around the trench, and the metal film 104 on the rest area is exposed. Referring to FIG. 2F, the exposed metal film 104 is etched by using the liquid photosensitive film pattern, and then the DFR film 110 remaining on the photosensitive film and the openings of the high aspect ratio trench 102 is removed, to form the metal wire 140. The metal wire 140 covers internal parts and external parts of the high aspect ratio trenches 102 and is connected electrically over corners and wall surfaces of the two-step trenches without any disconnection. The DFR film 110 is removed by using a remover used in the removing process. That is, it is removed by using a striper capable of removing a polymer binder with an excellent viscosity and photosensitivity.

FIGS. 3 to 8 are photomicrographs showing samples actually tested in the present invention.

Figure 3:
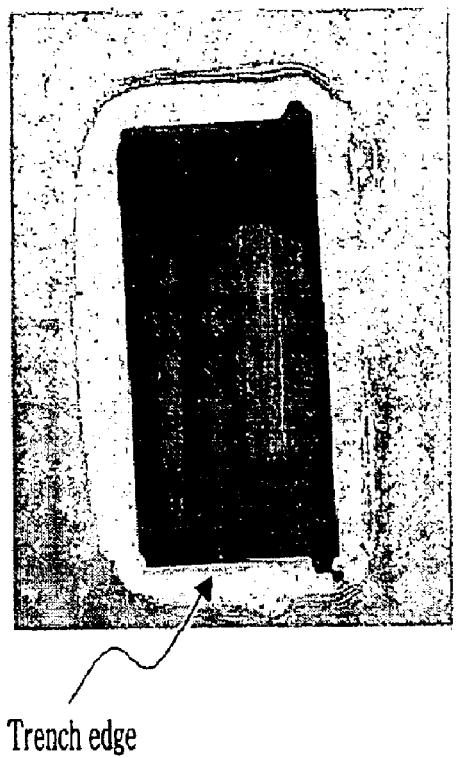
FIGS. 3 to 8 are photomicrographs showing samples actually tested in accordance with the present invention.
Figure 4:
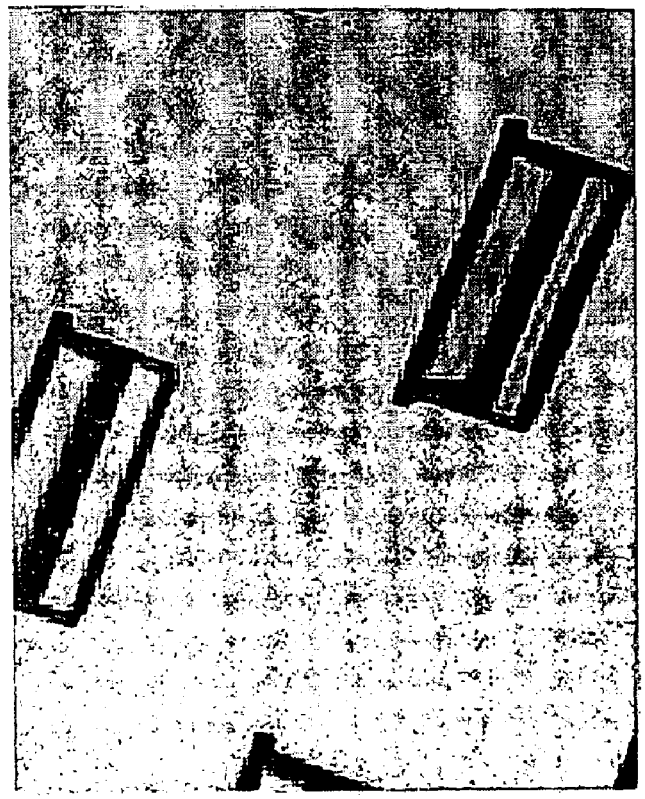

FIG. 3 is a photomicrograph showing that a two-step trench having depths of 150 $\mu$m and 102 $\mu$m is formed, and then, TSMR GA2 is spin-coated at a speed of 3000 rpm thereon to have an expected thickness of 2 $\mu$m wherein the GA2 is a kind of photoresist used in the general semiconductor test, as shown in FIG. 3, it can be observed that the photoresist is not coated around the trench. FIG. 4 is a photograph for comparing the trench having the DFR pattern with the trench having no DFR pattern on it, wherein the DFR pattern is the negative photoresist obtained by means of coating DFR on the two-stepped trench through a lamination method under a suitable pressure at a temperature in range of 70 to 90° C., exposing, and developing while using the photomask used for etching the trench. In other words, FIG. 4 shows that it is possible to form the DFR film pattern on the trench having a larger size than the area of the trench by 1 to 3 μm, by an exposing focal length of the DFR film is set to be longer than the focal length at the time of forming the trench, so that said patterned DFR film is slightly larger than the opening of the trench.

Figure 5:
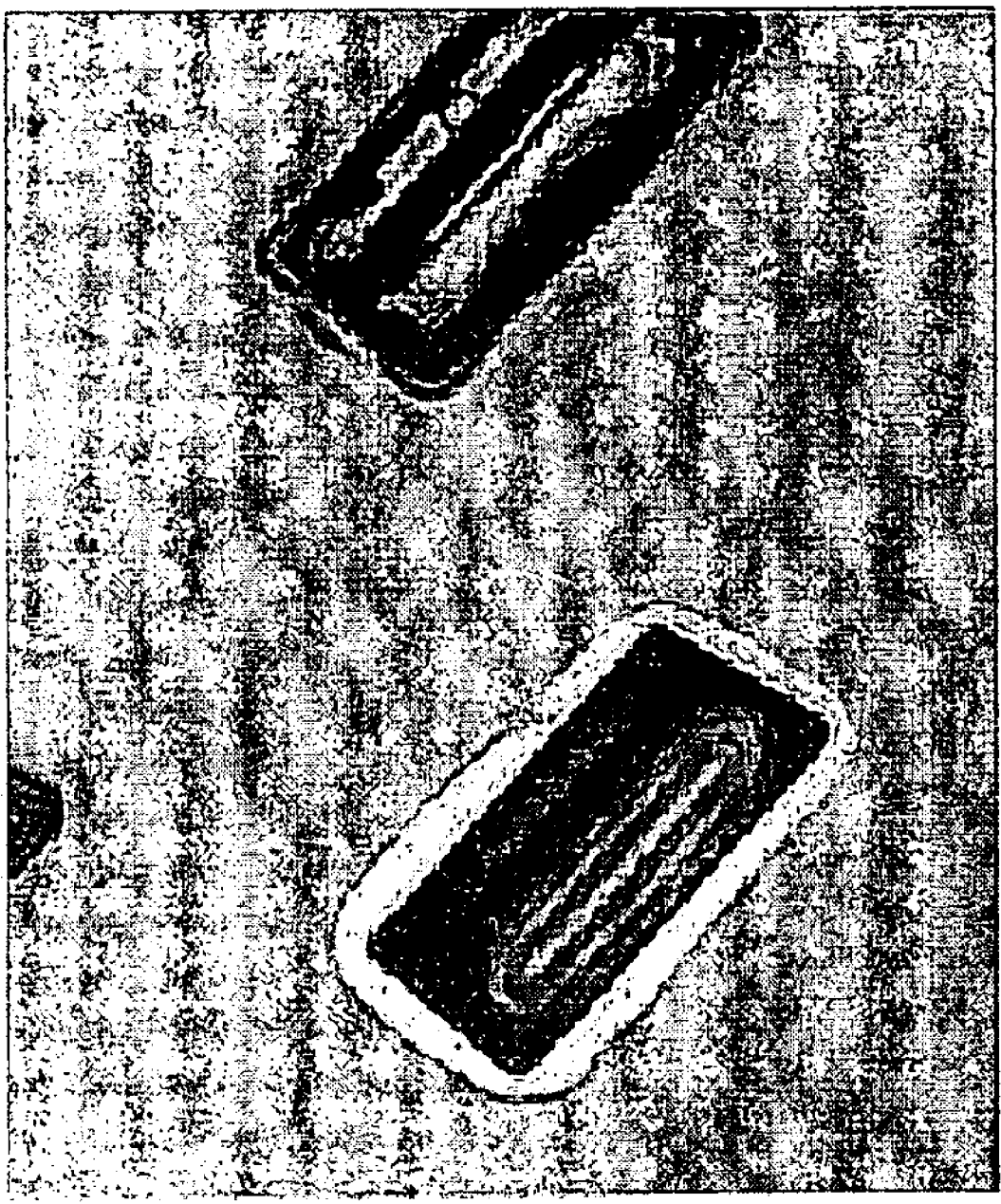

FIG. 5 is a photograph for comparing the trench on which the DFR film is formed similarly to FIG. 4 and then the GA2 photoresist is spin-coated thereon to have a thickness of 2 μm, with the trench on which the GA2 photoresist is directly coated. As shown in these figures, it is apparent that the DFR is useful in a photolithography of patterns having a high aspect ratio structure.

Figure 6:
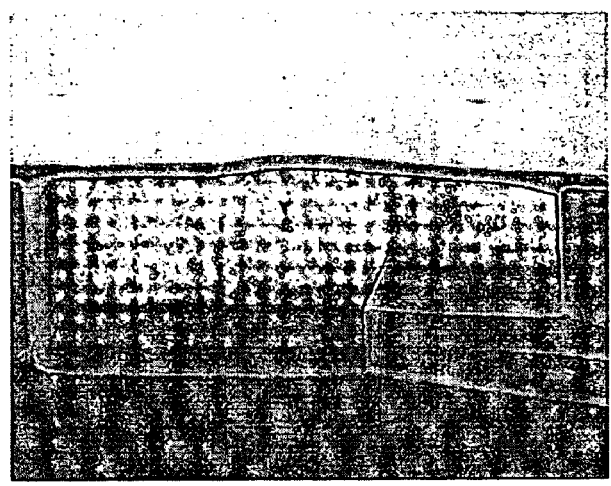

FIG. 6 is a photograph of a cross-sectional view of the sample in processes of FIG. 2C.

Figure 7:
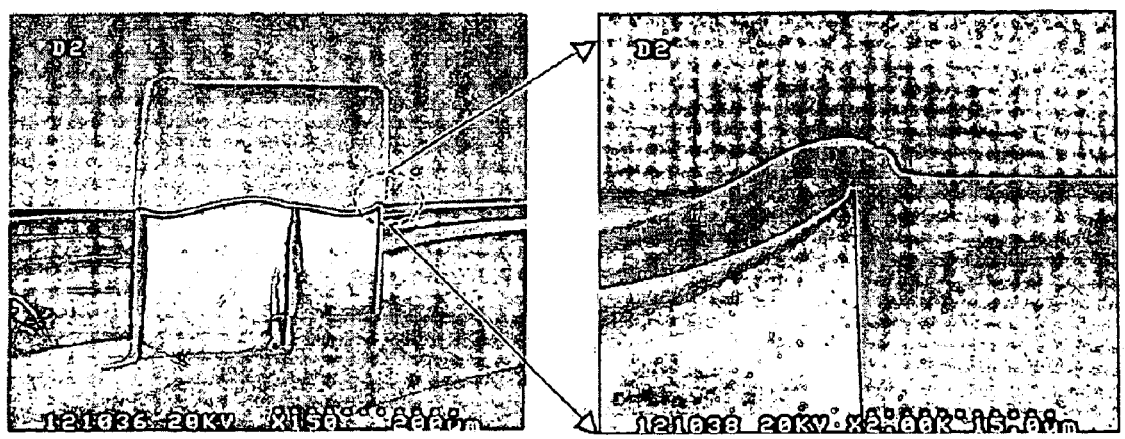

FIG. 7 is a photograph of a cross-sectional view of the sample in processes of FIG. 2D and a photograph of exemplifying a trench edge.

Figure 8A:
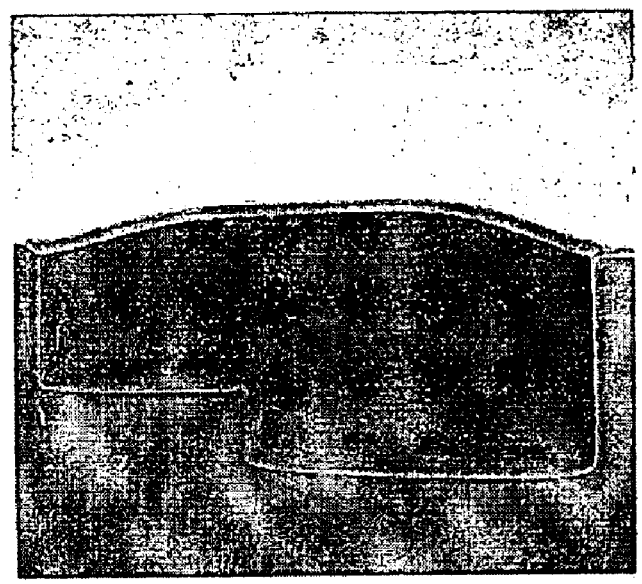

FIG. 8A is a photograph of a cross-sectional view of the sample in processes of FIG. 2E.

Figure 8B:
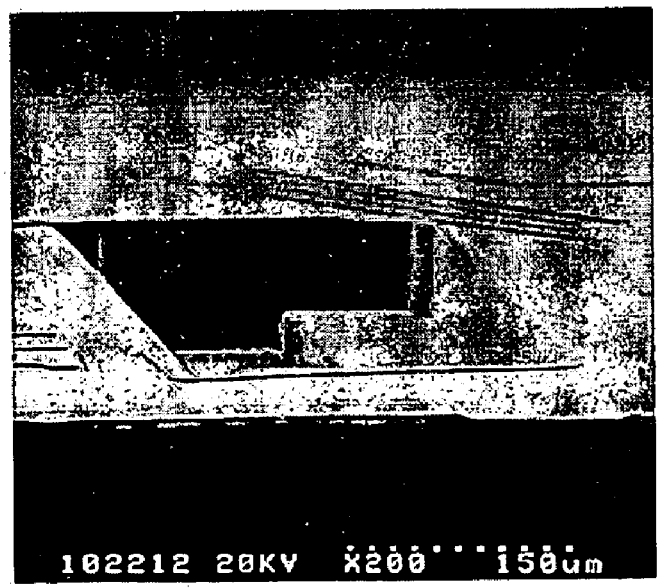

FIG. 8B is a photograph of a cross-sectional view of the sample in processes of FIG. 2F.

As described above, according to the present invention, it is possible to perform the photolithography process by blocking the opening of the high aspect ratio trench with the DFR film, and to prevent the liquid photoresist from flowing into the trench, when the liquid photoresist is deposited by a spin coating method to form the metal thin film pattern.

In addition, it is possible to stably attach the spin coating photoresist to an edge of the opening of the high aspect ratio trench.

What is clamed is:

1. A method of forming a photosensitive film pattern, comprising steps of:
    laminating a DFR film on a top of a substrate, thereby covering an opening of a trench of a high aspect ratio formed in the substrate;
    forming a DFR film pattern for blocking the opening of the trench by performing a first photolithography process, thereby forming a resultant structure; and
    forming the photosensitive film pattern by depositing a liquid photoresist on the resultant structure and performing a second photolithography process.

2. The method of forming a photosensitive film pattern according to claim 1, wherein the DFR film is deposited to have a thickness in a range of 1 to 70 μm at a temperature in a range of 70 to 100° C. by using an adhesive lamination method in a conventional printed circuit board industry.

3. The method of forming a photosensitive film pattern according to claim 1, wherein the DFR film consists of three layers, a base film, a photosensitive layer and a cover film.

4. The method of forming a photosensitive film pattern according to claim 1, wherein the DFR film is a photosensitive film including a polymer binder with an excellent viscosity and photosensitivity.

5. The method of forming a photosensitive film pattern according to claim 1, in said first photolithography process, an exposure process is performed by using a reticle for forming the trench.

6. The method of forming a photosensitive film pattern according to claim 5, wherein in the exposure process, an exposing focal length of the DFR film is set to be longer than the focal length at the time of forming the trench, so that said patterned DFR film is slightly larger than the opening of the trench.

7. The method of forming a photosensitive film pattern according to claim 1, wherein the trench has a depth in a range of 1to 1000 μm.

8. A method of forming a photosensitive film pattern, comprising steps of:
    forming a two-step trench having a high aspect ratio in a substrate;
    laminating a DFR film on a top of the substrate, thereby covering an opening of the trench;
    forming a DFR film pattern for blocking the opening of the trench by performing a first photolithography process, thereby forming a resultant structure; and
    forming the photosensitive film pattern by depositing a liquid photoresist on the resultant structure and performing a second photolithography process.

9. The method of forming a photosensitive film pattern according to claim 8, wherein the DFR film is deposited to have a thickness in a range of 1 to 70 μm at a temperature in a range of 70 to 100° C. by using an adhesive lamination method in a conventional printed circuit board industry.

10. The method of forming a photosensitive film pattern according to claim 8, wherein the DFR film consist of three layers, a base film, a photosensitive layer and cover film.

11. The method of forming a photosensitive film pattern according to claim 8, wherein the DFR film is a photosensitive film including a polymer binder with an excellent viscosity and photosensitivity.

12. The method of forming a photosensitive film pattern according to claim 8, in said first photolithography process, an exposing process is performed by using a reticle for forming the trench.

13. The method of forming a photosensitive film pattern according to claim 12, wherein in the exposing process, an exposing focal length of the DFR film is set to be longer than the focal length at the time of forming the trench, so that said patterned DFR film is slightly larger than the opening of the trench.

14. The method of forming a photosensitive film pattern according to claim 1, wherein the high aspect ratio structure trench has a depth in a range of 1 to 1000 μm.

15. A method of forming a photosensitive film pattern, comprising steps of:
    forming a highly stepped trench having a high aspect ratio in a substrate;
    forming a metal film on the substrate including inside of the trench;
    laminating a DFR film on a top of the substrate, thereby covering an opening of the trench;
    forming a DFR film pattern for blocking the opening of the trench by performing a first photolithography process, thereby forming a resultant structure; and
    forming the photosensitive film pattern by depositing a liquid photoresist on the resultant structure and performing a second photolithography process.

16. The method of forming a photosensitive film pattern according to claim 15, wherein the DFR film is deposited to have a thickness in a range of 1 to 70 μm at a temperature in a range of 70 to 100° C. by using an adhesive lamination method in a conventional printed circuit board industry.

17. The method of forming a photosensitive film pattern according to claim 15, wherein the DFR film consist of three layers, a base film, a photosensitive layer and cover film.

18. The method of forming a photosensitive film pattern according to claim 15, wherein the DFR film is a photosensitive film including a polymer binder with an excellent viscosity and photosensitivity.

19. The method of forming a photosensitive film pattern according to claim 15, in said first photolithography process, an exposing process is performed by using a reticle for forming the trench.

20. The method of forming a photosensitive film pattern according to claim 19, wherein in the exposing process, an exposing focal length of the DFR film is set to be longer than the focal length at the time of forming the trench, so that said patterned DFR film is slightly larger than the opening of the trench.

* * * * *